US007425832B2

(12) United States Patent
Gopal et al.

(10) Patent No.: US 7,425,832 B2
(45) Date of Patent: Sep. 16, 2008

(54) SYSTEM AND METHOD FOR MEASURING INTERNAL RESISTANCE OF ELECTROCHEMICAL DEVICES

(75) Inventors: Ravi B. Gopal, Oakville (CA); Norman Freeman, Richmond Hill (CA)

(73) Assignee: Hydrogenics Corporation, Mississauga (CA)

( * ) Notice: Subject to any disclaimer, the term of this patent is extended or adjusted under 35 U.S.C. 154(b) by 0 days.

(21) Appl. No.: 10/771,152

(22) Filed: Feb. 4, 2004

(65) Prior Publication Data

US 2004/0220752 A1    Nov. 4, 2004

Related U.S. Application Data

(60) Provisional application No. 60/444,696, filed on Feb. 4, 2003.

(51) Int. Cl.
G01N 27/42 (2006.01)
(52) U.S. Cl. ........................ 324/426; 324/434
(58) Field of Classification Search ................ 320/116, 320/117, 118, 119; 324/425, 426, 434; 702/64, 702/65
See application file for complete search history.

(56) References Cited

U.S. PATENT DOCUMENTS

| | | | |
|---|---|---|---|
| 3,676,770 | A | 7/1972 | Sharaf et al. |
| 3,753,094 | A | 8/1973 | Furuishi et al. |
| 4,071,819 | A | 1/1978 | De Santis |
| 4,316,185 | A | 2/1982 | Watrous et al. |
| 4,352,067 | A | 9/1982 | Ottone |

(Continued)

FOREIGN PATENT DOCUMENTS

DE    37 02 591    11/1988

(Continued)

OTHER PUBLICATIONS

T. E. Springer, T. A. Zawodzinski, M.S. Wilson and S. Gottesfield, "Characterization of polymer electrolyte fuel cells using AC impedance spectroscopy", Journal of the electrochemical Society of America, 143(2), p. 587-599, 1996.

(Continued)

Primary Examiner—Adolf Berhane
Assistant Examiner—Samuel Berhanu
(74) Attorney, Agent, or Firm—Bereskin & Parr

(57) ABSTRACT

A method and system are provided for measuring impedance and voltage characteristics of individual cells of multi-cell electrochemical devices, for example a battery or a fuel cell stack. The electrochemical system comprises a plurality of cells; a measuring device including a plurality of inputs connected across the plurality of cells to generate voltage and current signals indicative of voltage and current characteristics of the plurality of cells; a current supply/draw means for superimposing modulated current values through the plurality of cells; and a controller for controlling at least one system operating condition based on the voltage and current characteristics received from the measuring device, the controller being connected to the measuring device. The method comprises (a) superimposing modulated current values across a plurality of cells of the electrochemical device; (b) drawing current from the plurality of cells to generate voltage and current signals indicative of voltage and current characteristics of the plurality of cells; and, (c) controlling the at least one system operating condition based on the voltage and current characteristics of the plurality of cells, wherein the at least one system operating condition comprises at least one of temperature, humidity and reactant flow rates, within the electrochemical system.

26 Claims, 5 Drawing Sheets

U.S. PATENT DOCUMENTS

| | | | |
|---|---|---|---|
| 4,484,140 A | 11/1984 | Dieu | |
| 4,697,134 A | 9/1987 | Burkum et al. | |
| 4,743,855 A | 5/1988 | Randin et al. | |
| 4,833,459 A | 5/1989 | Geuer et al. | |
| 4,916,734 A * | 4/1990 | Stader et al. | 379/339.02 |
| 4,931,947 A * | 6/1990 | Werth et al. | 700/297 |
| 4,972,181 A | 11/1990 | Fiene | |
| 5,047,722 A | 9/1991 | Wurst et al. | |
| 5,170,124 A | 12/1992 | Blair et al. | |
| 5,281,920 A | 1/1994 | Wurst | |
| 5,416,416 A * | 5/1995 | Bisher | 324/426 |
| 5,608,307 A | 3/1997 | Garrett et al. | |
| 5,670,861 A | 9/1997 | Nor | |
| 5,712,568 A | 1/1998 | Flohr et al. | |
| 5,773,978 A | 6/1998 | Becker | |
| 5,914,606 A | 6/1999 | Becker-Irvin | |
| 5,923,148 A | 7/1999 | Sideris et al. | |
| 5,925,476 A * | 7/1999 | Kawatsu | 429/24 |
| 5,969,625 A * | 10/1999 | Russo | 340/636.19 |
| 6,002,238 A | 12/1999 | Champlin | |
| 6,011,379 A | 1/2000 | Singh et al. | |
| 6,037,777 A | 3/2000 | Champlin | |
| 6,140,820 A | 10/2000 | James | |
| 6,160,382 A * | 12/2000 | Yoon et al. | 320/136 |
| 6,208,147 B1 * | 3/2001 | Yoon et al. | 324/430 |
| 6,239,579 B1 * | 5/2001 | Dunn et al. | 320/121 |
| 6,281,684 B1 | 8/2001 | James | |
| 6,285,164 B1 | 9/2001 | Noda et al. | |
| 6,297,618 B2 | 10/2001 | Emori et al. | |
| 6,307,350 B1 | 10/2001 | Alderman | |
| 6,313,750 B1 | 11/2001 | Lacy | |
| 6,335,611 B1 | 1/2002 | Sasaki | |
| 6,392,386 B2 | 5/2002 | Schulmayr et al. | |
| 6,406,806 B1 | 6/2002 | Keskula et al. | |
| 6,417,670 B1 | 7/2002 | Kang | |
| 6,432,569 B1 | 8/2002 | Zeilinger et al. | |
| 6,455,180 B1 | 9/2002 | Mowery et al. | |
| 6,519,539 B1 * | 2/2003 | Freeman et al. | 702/65 |
| 2002/0025464 A1 | 2/2002 | Breur | |
| 2002/0051899 A1 | 5/2002 | Keskula et al. | |
| 2002/0053896 A1 | 5/2002 | Adams et al. | |
| 2002/0180447 A1 | 12/2002 | Masse et al. | |
| 2002/0196025 A1 | 12/2002 | Freeman et al. | |

FOREIGN PATENT DOCUMENTS

| | | |
|---|---|---|
| DE | 100 36 572 | 2/2002 |
| EP | 0575205 | 12/1993 |
| EP | 1 134 868 | 9/2001 |
| JP | 359215674 | 12/1984 |
| JP | 01160367 | 6/1989 |
| JP | 2000092732 | 3/2000 |
| WO | WO 99/18448 | 4/1999 |
| WO | WO 00/31557 | 6/2000 |
| WO | WO 01/09631 | 2/2001 |
| WO | WO 01/14898 | 3/2001 |
| WO | WO 02/03086 | 1/2002 |
| WO | WO 02/27342 | 4/2002 |
| WO | WO 03/083498 | 10/2003 |

OTHER PUBLICATIONS

J.R. Selman and Y.P. Lin, "Application of AC impedance in fuel cell research and development", Electrochemica Acta, 38(14), p. 2063-2073, 1993.

B. Elsener and H. Bolmi, "Computer-assisted DC and AC techniques in electrochemical investigations of the active-passive transition", Corrosion Science, 23(4), p. 341-352, 1983.

German Office Action, Nov. 24, 2006.

* cited by examiner

SYSTEM AND METHOD FOR MEASURING INTERNAL RESISTANCE OF ELECTROCHEMICAL DEVICES

FIELD OF THE INVENTION

The present invention relates generally to a system and method for measuring internal resistance of an electrochemical device. More particularly, it relates to a system and method for measuring the internal resistance of individual fuel cells within a fuel cell stack, the fuel cell stack operating under dynamic fluid flow conditions as well as under varying load conditions, either during testing of the stack or during stand-alone power generation in a realworld application.

BACKGROUND OF THE INVENTION

A fuel cell is an electrochemical device that produces an electromotive force by bringing the fuel (typically hydrogen) and an oxidant (typically air) into contact with two suitable electrodes and an electrolyte. A fuel, such as hydrogen gas, for example, is introduced at a first electrode where it reacts electrochemically in the presence of the electrolyte to produce electrons and cations in the first electrode. The electrons are circulated from the first electrode to a second electrode through an electrical circuit connected between the electrodes. Cations pass through the electrolyte to the second electrode. Simultaneously, an oxidant, such as oxygen or air is introduced to the second electrode where the oxidant reacts electrochemically in presence of the electrolyte and catalyst, producing anions and consuming the electrons circulated through the electrical circuit; the cations are consumed at the second electrode. The anions formed at the second electrode or cathode react with the cations to form a reaction product. The first electrode or anode may alternatively be referred to as a fuel or oxidizing electrode, and the second electrode may alternatively be referred to as an oxidant or reducing electrode. The half-cell reactions at the two electrodes are, respectively, as follows:

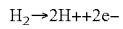

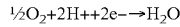

The external electrical circuit withdraws electrical current and thus receives electrical power from the cell. The overall fuel cell reaction produces electrical energy as shown by the sum of the separate half-cell reactions written above. Water and heat are typical by-products of the reaction.

In practice, fuel cells are not operated as single units. Rather, fuel cells are connected in series, stacked one on top of the other, or placed side by side. A series of fuel cells, referred to as fuel cell stack, is normally enclosed in a housing. The fuel and oxidant are directed through manifolds to the electrodes, while cooling is provided either by the reactants or by a cooling medium. Also within the stack are current collectors, cell-to-cell seals and insulation, with required piping and instrumentation provided externally of the fuel cell stack. The stack, housing, and associated hardware make up the fuel cell module.

Various parameters have to be monitored to ensure the proper operation of a fuel cell stack and evaluate the performance thereof. These parameters include the voltage across each fuel cell in the fuel cell stack, hereinafter referred to as cell voltage, and the internal resistance of each fuel cell.

Issues arise when designing systems for monitoring these parameters, such as portability, fuel cell applicability, measurement variety, resolution, automation and cost. These issues have been addressed, to some extent, in the assignee's co-pending U.S. patent application Ser. No. 09/672,040 and No. 10/109,003, that describe a self-contained, portable apparatus/system for measuring fuel cell impedance during fuel cell testing and a related method. The system comprises a CPU, frequency synthesizer, a fuel cell, a load bank and measurement and acquisition circuitry. The CPU receives input parameters from a software program and sends the parameters to a signal generation device, which produces an AC waveform with a DC offset that is used to remotely program a load bank. The load bank draws current from the fuel cell. The voltage across the fuel cell and the current through the fuel cell are measured by voltage and current sensing circuitry, then digitized and averaged by an oscilloscope or A/D converter. The recorded data is sent to the CPU where the AC phase lead or lag is calculated. Numerous outputs can then be displayed by the invention, including real impedance, imaginary impedance, phase difference, leading component, lagging component, current magnitude, voltage magnitude and applied AC voltage.

However, the inventions of the earlier applications have limited application in the measurement of fuel cell impedance in fuel cell stacks during actual operation of the fuel cell stack ("in the field" operation). Further, a scheme for measuring the internal resistance of individual fuel cells within a fuel cell stack in a real-time manner is not detailed in the previous patent application.

In order to measure cell voltages, differential voltage measurement is required at the two terminals (i.e. anode and cathode) of each fuel cell. However, since fuel cells are connected in series, and typically in large number, the voltages at some terminals will be too high for any currently available semiconductor measuring device to directly measure. For example, for a fuel cell stack consisting of 100 cells with each cell voltage at 0.95 V, the actual voltages on the negative terminal (cathode) of the top cell will be 94.05 V (i.e. 0.95*100−0.95). As such, the voltage exceeds the maximum allowable input voltage of most current differential amplifiers commonly used for measuring voltage.

The assignee's co-pending U.S. patent application Ser. No. 09/865,562 provides a solution for this problem. This patent application provides a system for monitoring cell voltages of individual fuel cells in a fuel cell stack during testing; the contents of U.S. patent application Ser. Nos. 09/865,562, 09/672,040 and 10/109,003 are hereby incorporated by reference. The system of patent application Ser. No. 09/865,562 comprises a plurality of differential amplifiers, a multiplexer, an analog to digital converter, a controller and a computer. Each of the differential amplifiers reads the voltages at two terminals of each fuel cell. The analog to digital converter reads the output of the differential amplifiers via the multiplexer, which provides access to one of these differential amplifiers at any given time. The digital output of the analog to digital converter is then provided to the computer for analysis. The computer controls the operation of the analog to digital converter and the multiplexer. However, the voltage monitoring system in this patent application only measures the DC voltage across individual fuel cells. In contrast, in the aforementioned U.S. patent application Ser. No. 09/672,040, which described a method and system used in fuel cell testing, the measurement of impedance involves applying both AC and DC voltages across a complete fuel cell stack, whether this is a single fuel cell or a stack of many fuel cells.

Thus, there is still need for a system that is suitable for measuring internal resistance of individual fuel cells within a fuel cell stack, especially a stack consisting of a large number of fuel cells, during actual use of the fuel cell "in the field", as opposed to a controlled testing environment used for fuel cell testing purposes.

SUMMARY OF THE INVENTION

In accordance with an aspect of the invention, there is provided an electrochemical system. The electrochemical system comprises a plurality of cells; a measuring device including a plurality of inputs connected across the plurality of cells to generate voltage and current signals indicative of voltage and current characteristics of the plurality of cells; a current supply/draw means for superimposing modulated current values through the plurality of cells; and a controller for controlling at least one system operating condition based on the voltage and current characteristics received from the measuring device, the controller being connected to the measuring device, wherein the at least one system operating condition includes at least one of temperature, humidity, and reactant flow rates, within the electrochemical system.

The modulator is advantageously arranged to superimpose the modulated current values in burst time periods for high frequency resistance measurement, with time periods between burst time periods of no superimposition of modulated current values.

The modulator has, for example, a current control device coupled to a sine wave generator for generating the superimposed current values. Any periodic waveform is useable for modulating the current values, for example sine, square, triangle, saw tooth, rectangular or any other stepped waveform.

Advantageously, the measuring device provides a plurality of primary channels for the voltage and current signals, there being one channel for the voltage across each cell, and wherein the measuring device includes a splitter for separating out at least the DC components of the voltages across the individual cells from the primary channels, the splitter having first channels as outputs for the DC components.

The splitter advantageously includes second channels as outputs for the AC components of the voltages across the individual cells.

The measuring device advantageously includes a plurality of instrumentation amplifiers connected to the inputs of the measuring device and having outputs providing the plurality of the primary channels and an analog multiplexer connected to at least two channels from the splitter, wherein a multiplexer control line is connected between the controller and the analog multiplexer for controlling the analog multiplexer to switch sequentially between the channels.

The apparatus further advantageously includes a first analog to digital converter connected to the output of the analog multiplexer, a voltage data bus connected between the first analog to digital converter and the controller and an analog to digital control line connected between the controller and the first analog to digital converter for control thereof.

A current sensing device (transducer) is advantageously provided connected in series with the individual cells for measuring the current, wherein the current sensing device is connected to the controller. Outputs of the current sensing device are optionally connected to a current amplifier and wherein the current amplifier has an output for a current measurement signal connected to the controller.

A current analog to digital converter is advantageously provided having an input connected to the output of the current amplifier and having a current output and a control input, and wherein a data bus connects the current output to the controller and an analog to digital control line is provided between the controller and the control input of the current analog to digital converter.

The controller optionally includes an input, connectable to a computing device for supplying control signals for controlling the controller.

In accordance with a second aspect of the invention, there is provided a method of controlling at least one system operating condition of a multi-cell electrochemical system. The method comprises (a) superimposing modulated current values across a plurality of cells of the electrochemical device; (b) drawing current from the plurality of cells to generate voltage and current signals indicative of voltage and current characteristics of the plurality of cells; and, (c) controlling the at least one system operating condition based on the voltage and current characteristics of the plurality of cells, wherein the at least one system operating condition includes at least one of temperature, humidity, and reactant flow rates, within the electrochemical system.

Step (a) is advantageously performed in burst time periods for high frequency resistance measurement, with time periods between burst time periods of no superimposition of modulated current values.

Advantageously, step (a) comprises controlling the superimposition of the modulated current values to provide a series of set interference conditions, and measuring, for each interference condition, at least some of the voltage and current characteristics of the electrochemical device. For example, a frequency of the superimposed current values is varied, the voltage and current measurements and/or waveforms are measured at selected frequencies for the superimposed current values, and real and imaginary components of the impedance of the individual cells are determined from the voltage and current characteristics measured. Then, at least one system operating condition is controlled based on the real and imaginary components of the impedance of the individual cells.

Advantageously, the method further comprises connecting inputs of a plurality of differential amplifiers across individual cells of the electrochemical device, measuring the voltage and current of the cells with the plurality of differential amplifiers to generate a plurality of voltage and current signals, supplying the voltage and current signals to a multiplexer and operating the multiplexer to sequentially supply the voltage and current signals to a controller to perform step (c). Optionally, the method further comprises converting each voltage and current signal selected by the analog multiplexer to a digital signal in a voltage analog to digital converter.

The method further advantageously comprises providing a current sensing device connected in series with the cells for measuring the current through the load, measuring the voltage across the current sensing device to determine the current through the load and thereby generate a current measurement signal. The current measurement signal is then supplied to the controller. The method optionally includes the following steps: converting the current measurement signal to a digital current measurement signal, and supplying the digital current measurement signal to the controller.

For both aspects of the invention, the voltages measured need not be across each individual cell. It is possible that voltages could be measured across just some of the cells, and/or some individual voltages could be measured across a group of cells.

BRIEF DESCRIPTION OF THE DRAWINGS

For a better understanding of the present invention and to show how it may be carried into effect, reference will now be made, by way of example, to the accompanying drawings which show a preferred embodiment of the present invention and in which.

DETAILED DESCRIPTION OF THE PREFERRED EMBODIMENTS OF THE INVENTION

Figure 1:
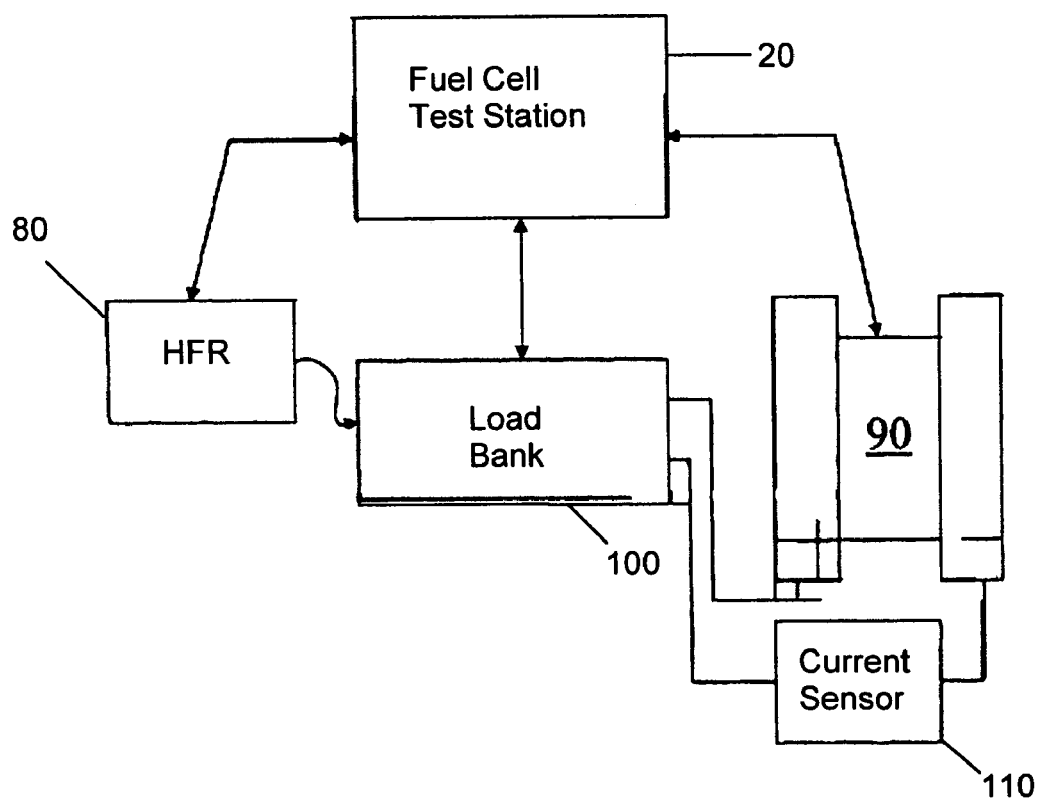
FIG. 1 is a schematic view of a system for measuring fuel cell voltage and resistance during fuel cell (stack) testing in accordance with the prior art.

Reference is made to FIG. 1, which illustrates a prior art apparatus and method of testing fuel cells or fuel cell stacks (generally designated with the numeral 90 in the figure). A fuel cell test station 20 is connected to the fuel cell(s) 90, a load bank 100 and a HFR (high frequency resistance) device 80. The load bank 100 is a controllable artificial load for providing a certain pre-configured load characteristic for testing the fuel cell(s) 90, and the HFR device 80 provides a configurable AC perturbation voltage to be superimposed on the DC current drawn by the load bank 100. The fuel cell(s) 90 is/are of any type compatible with the fuel cell test station. The fuel cell(s) 90 is/are electrically connected to the load bank 100, with ground connections in known manner. The load bank 100 is advantageously a standard load bank, which can be set to apply a desired voltage or draw a desired current. Additionally, for current measuring purposes, a current sensing device 110 is provided in the circuit including the fuel cell stack 90 and the load bank 100, the current sensing device 110 being connected across the load bank 100. The current sensing device 110 is for example a transducer or a shunt.

In order to test the fuel cell stack 90 it is required for the output of the fuel cell(s) 90 to be a constant, DC level with a superimposed alternating level. The fuel cell test station 20 controls the load bank 100 to draw a desired, usually large, DC current, The load bank 100 is further controlled by the HFR device 80 to drawn an AC perturbation that is superimposed on the DC current and is generally relatively small. The perturbation waveform function may be stored in a control device (not shown) of the fuel cell test station 20. This method is commonly referred to as a high frequency resistance measurement technique.

Figure 2A:
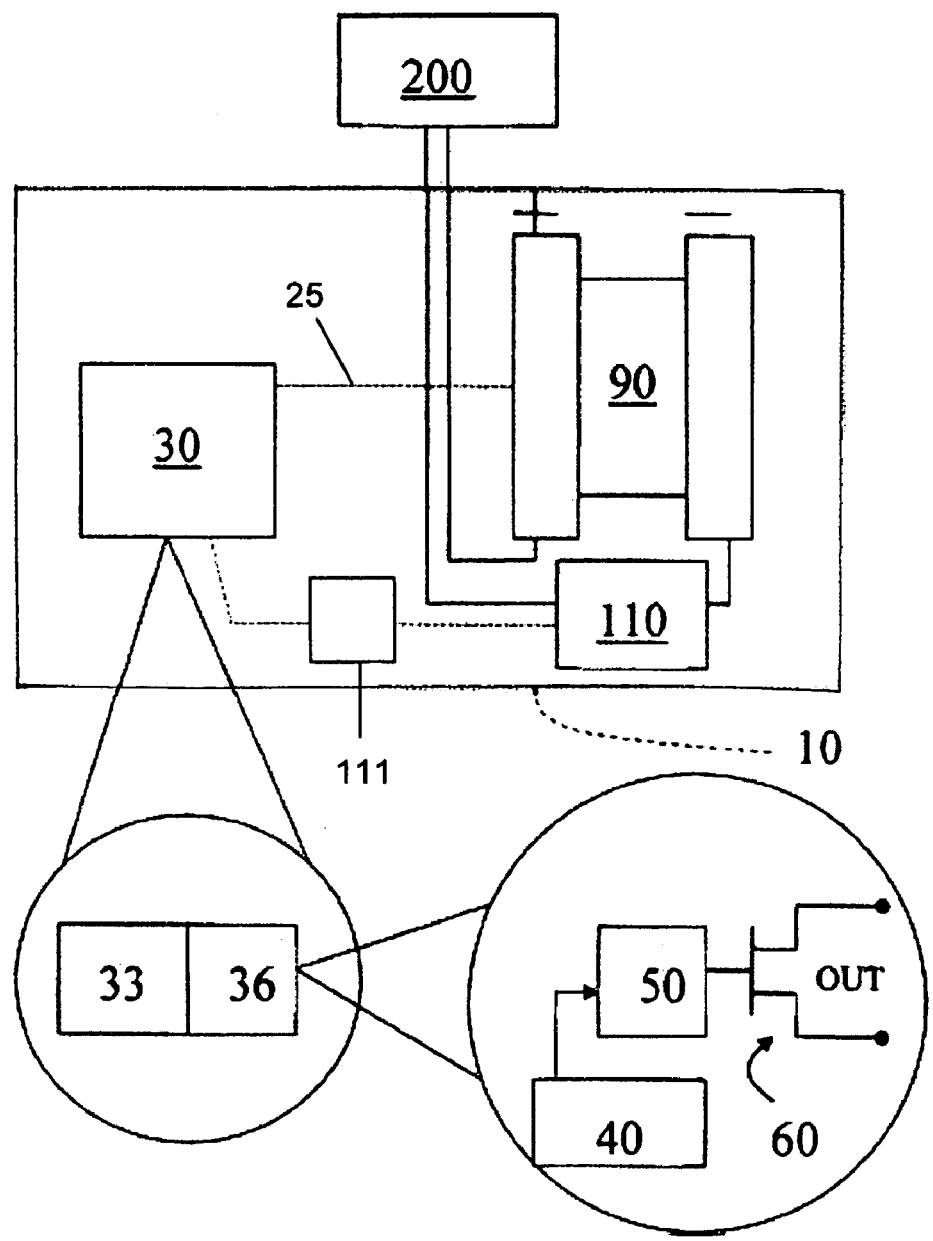
FIG. 2a is a schematic view of a system for measuring fuel cell voltage and resistance according to a preferred embodiment of the present invention.
Figure 2B:
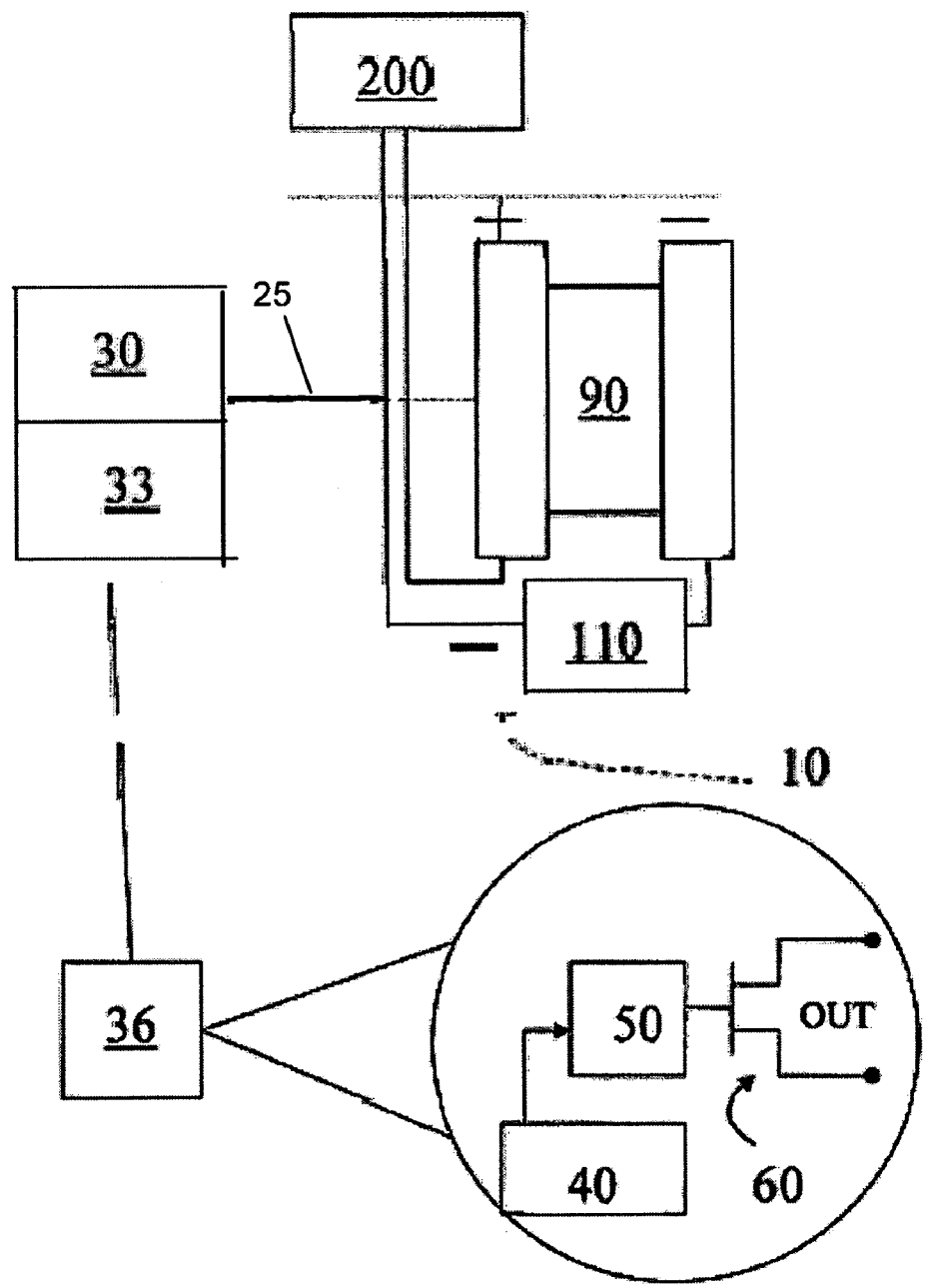
FIG. 2b is a schematic view of a system for measuring fuel cell voltage and resistance according to a further preferred embodiment of the present invention.

Reference is now made to FIGS. 2a and 2b, which illustrate preferred embodiments of a self-contained, portable apparatus 10 for impedance measurement of a fuel cell at discrete frequencies and during actual use of the fuel cell as described below according to the present invention. During actual use, the fuel cell will be connected to an actual load, which may, unlike a test load, vary in unexpected ways that cannot be easily controlled by a user/operator.

Figure 2C:
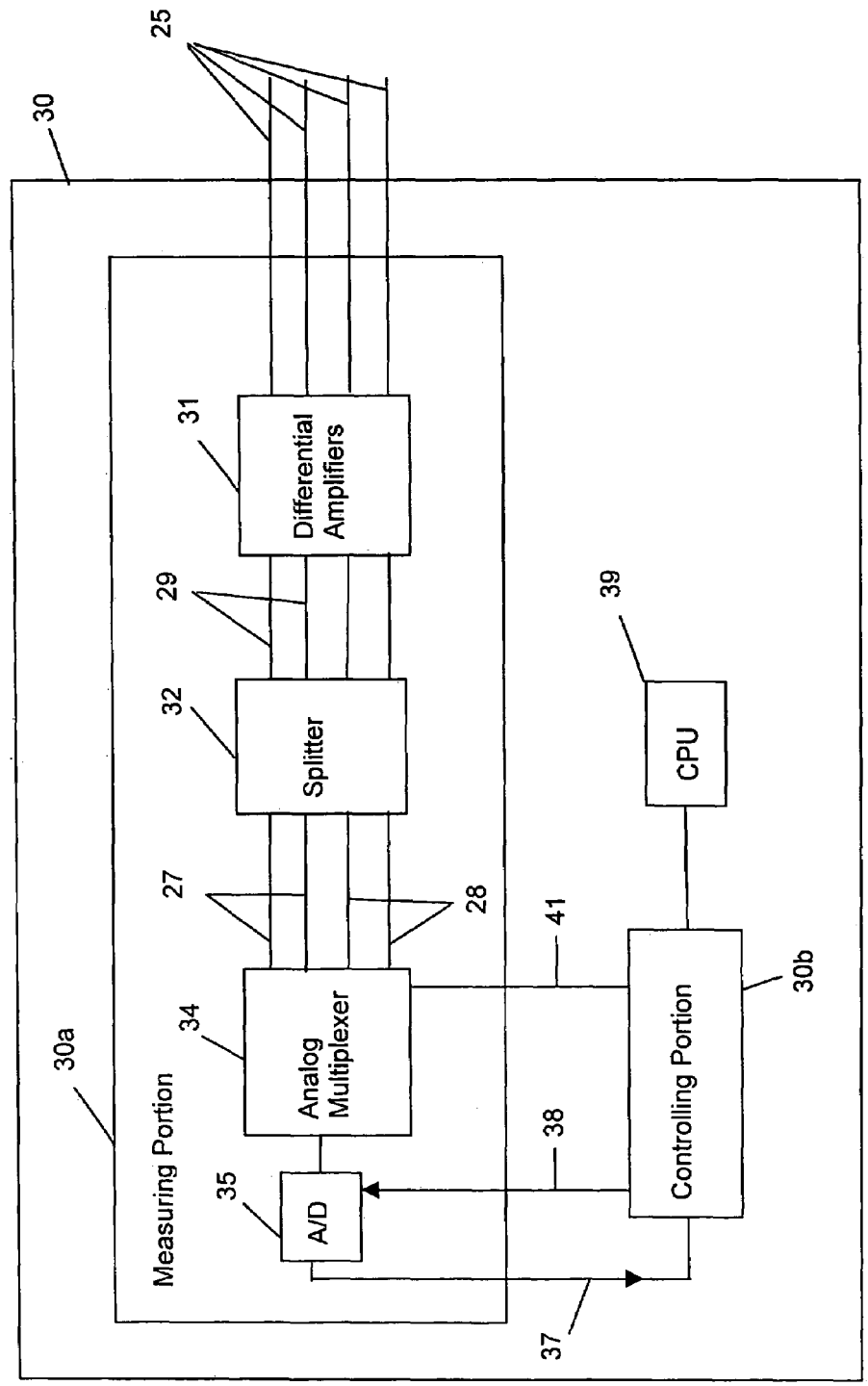
FIG. 2c is a block diagram illustrating a control device of FIGS. 2a and 2b in more detail; and, FIG. 3 is a schematic diagram of a cell current measurement over time on a fuel cell stack using the system shown in FIGS. 2a and 2b.

A fuel cell power unit, generally designated using the reference numeral 10 in FIGS. 2a and 2b, has a fuel cell stack 90 and a control device 30 for regulating the fuel cell stack 90 according to predetermined fuel cell power unit operation schemes, advantageously stored in the control device 30. The control device 30 of FIGS. 2a and 2b is illustrated in more detail in FIG. 2c. The control device 30 has a measuring portion 30a with a plurality of inputs 25 for connection across the individual cells of the fuel cell (or other electrochemical device), to generate voltage and current signals indicative of the measured voltages and currents, and a controlling portion 30b connected to and controlling the measuring portion 30a and for receiving the voltage and the current signals from the measuring portion 30a. The control device 30 thus maintains the Balance-of-Plant during operation of the power unit 10 by regulating process gas flows, water purging, and other process parameters by manipulating devices such as fans and valves (these different devices are not shown).

The cell voltages of individual fuel cells within the fuel cell stack 90 are measured directly, for instance using a bank of instrumentation amplifiers, which are preferably differential amplifiers 31, which generate voltage signals. The current through the fuel cell stack 90 is measured indirectly using the current sensing device 110. The current sensing device 110 has a known resistive value and near zero inductive or capacitive component, and is connected across a purely resistant component of the load bank in known manner. A differential amplifier (not shown) is connected to the current sensing device 110 to measure the voltage drop across the current sensing device 110, and to generate a current measurement signal. Outputs of the current sensing device 110 are optionally connected to a current amplifier 111 having an output for a current measurement signal connected to the controlling portion 30b of the control device 30.

The control device 30 comprises a HFR/FCVM (fuel cell voltage monitoring) unit 33 and a modulator 36, see FIG. 2a. Alternatively, the modulator can be part of an external device, such as a power supply (not shown), see FIG. 2b. The HFR/FCVM unit measures voltage and current signals in the fuel cell 90, and controls the generation of an AC perturbation current that is superimposed by the modulator 36 on the DC current drawn by a real load 200, The modulator 36 advantageously has a current control device 40, which regulates a waveform generator 50, which in turn outputs the generated AC perturbation via an output device 60, for example a MOSFET transistor. The AC perturbation, preferably, is superimposed only in bursts, i.e. for short time periods during normal fuel cell operation. Typically, the superimposition lasts for a certain predetermined number of seconds with a preset rest period between superimposition bursts. The AC perturbation is of low amplitude, relative the drawn DC current, and is thus a low excitation current.

The modulator 36 has, for example, a current control device coupled to a sine wave generator for generating the superimposed current values. Any periodic waveform is useable for modulating the current values, for example sine, square, triangle, saw tooth, rectangular or any other stepped waveform.

Figure 3:
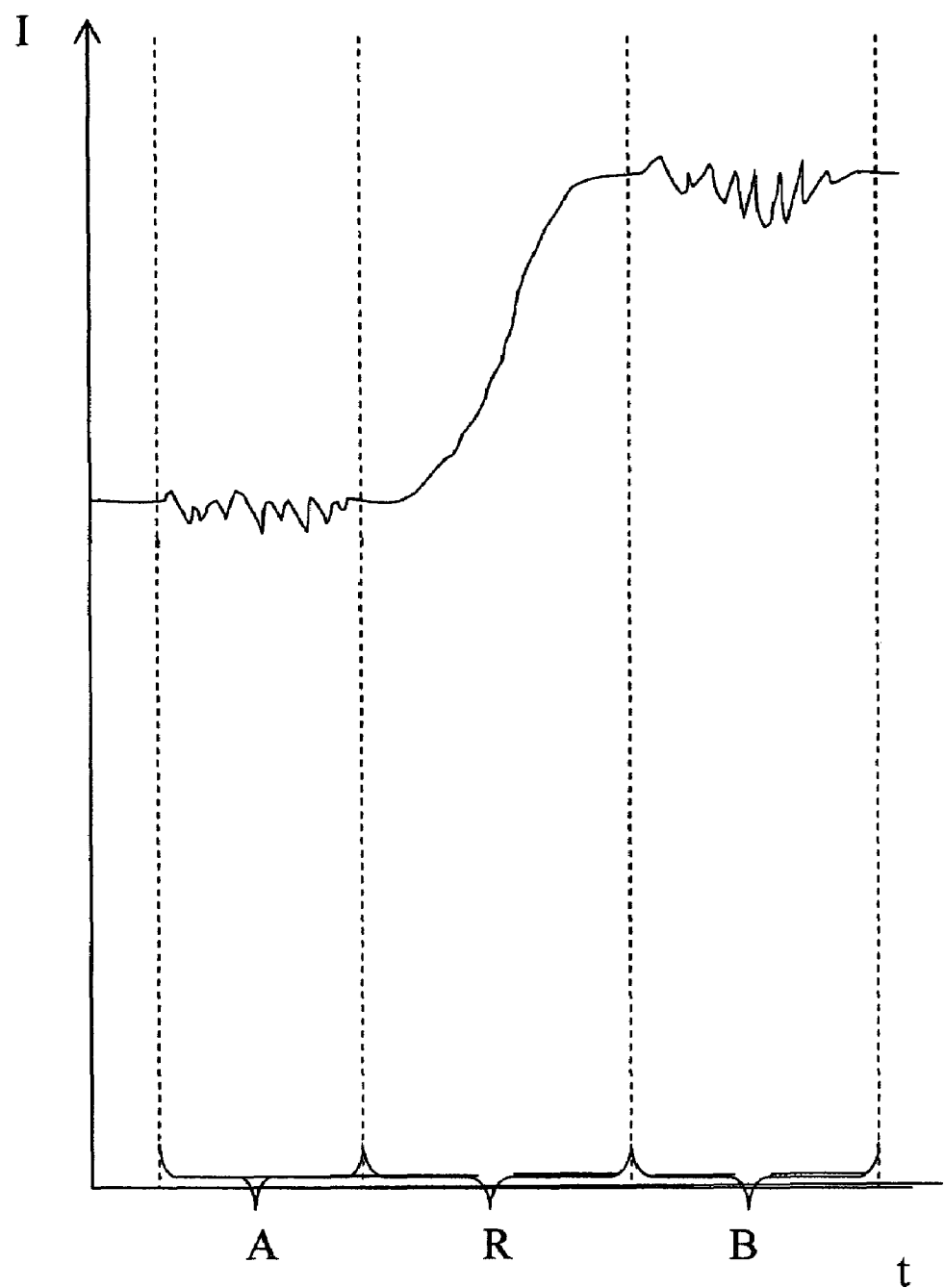

The current drawn by a typical real load 200 is shown in FIG. 3. A first AC perturbation is generated and superimposed during time period A. After a rest period R, a second AC perturbation is generated and superimposed, in the example after the real load 200 has drawn a larger DC current from the fuel cells. Using voltage and current signals obtained by the control device 30, the high frequency resistance of the fuel cell stack can be calculated in real time during actual use of the fuel cell, and any anomalies can either be reported to a fuel cell operator or automatically dealt with by the control system itself. The control device 30 may automatically deal with these anomalies by, for example, adjusting the temperature, humidity or reactant flow rates within the fuel cell system. Alternatively, if alarm conditions exist, then the control device 30 may activate an alarm or otherwise notify an operator of the alarm condition. Note that the superimposition of the AC perturbation can be done either during static load or under dynamic load conditions.

Advantageously, the measuring portion 30a of the control device 30 provides a plurality of primary channels 29 for the voltage and current signals, there being one channel for the voltage across each cell. The measuring portion 30 a further includes a splitter 32 for separating out DC components of the voltages across the individual cells from the primary channels 29, the channel splitter 32 having first channels 27 as outputs for the DC components across the individual cells.

The splitter 32 advantageously includes second channels 28 as outputs for the AC components of the voltages across the individual cells.

Preferably, the superimposition of the modulated current values is controlled to provide a series of set interference conditions. Then, for each interference condition at least some of the voltage and current characteristics of the electrochemical device are measured. For example, a frequency of the superimposed current values is varied, the voltage and current and current measurements and/or waveforms are measured at selected frequencies for the superimposed current values, and real and imaginary components of the impedance of the individual cells are determined from the voltage and current characteristics measured. Then, the electrochemical device can be controlled partially on the basis of these real and imaginary components of the impedance of the cells.

As described above, the measuring portion 30a further advantageously includes the plurality of instrumentation amplifiers 31 connected to the plurality of inputs 25 of the measuring device and having outputs providing the plurality of the primary channels 29. Further, an analog multiplexer 34 is advantageously connected to at least the first channels 27 from the channel splitter 32, and a multiplexer control line 41 is connected between the controlling portion 30b and the analog multiplexer 34 for controlling the analog multiplexer 34 to switch sequentially between at least the first channels 27.

The fuel cell system 10 further advantageously includes a first analog to digital converter 35 connected to the output of the analog multiplexer 34, a voltage data bus 37 connected between the first analog to digital converter 35 and the controlling portion 30b and an analog to digital control line 38 connected between the controlling portion 30b and the first analog to digital converter 35 for control of the same.

A current analog to digital converter (not shown) is advantageously provided having an input connected to the output of the current amplifier 111 and having a current output and a control input. A data bus (not shown) connects the current output to the controlling portion 30b and an analog to digital control line (not shown) is provided between the controlling portion 30b and the control input of the current analog to digital converter.

The current sensing device (transducer) 110 is advantageously provided connected in series with the individual cells for measuring the current. The current sensing device 110 is connected to the controller. Outputs of the current sensing device 110 are optionally connected to a the current amplifier 111, which has an output connected to the controller for providing a current measurement signal to the controller.

The controlling portion 30b optionally includes an input, connectable to a computing device 39 for supplying control signals for controlling the controlling portion 30b.

Preferably, each cell of the electrochemical device is calibrated by measuring each voltage across the individual cell. The cell voltage for each fuel cell, measured by a given differential amplifier, can then be calculated using the following equation:

$$V_R = V_A * V_{A/D} / [V_{A/D}(V_A) - V_{A/D}(V_O)] - V_{OFF} \qquad (1)$$

Where: $V_R$ is the calibrated measured cell voltage;

$V_{A/D}$ is the output value of the A/D converter 70 during cell voltage measurement;

$V_A$ is the voltage applied differentially to the inputs of the differential amplifier during calibration;

$V_{A/D}(V_A)$ is the output value of the A/D converter 70 when $V_A$ is applied to the inputs of the differential amplifier during calibration;

$V_{A/D}(V_O)$ is the output value of the A/D converter 70 when the inputs of the differential amplifier are tied to ground during calibration;

$V_{OFF}$ is the voltage output of the differential amplifier when the inputs of the differential amplifier are tied to ground during calibration.

The present invention uses commonly available components which are inexpensive and do not require any hardware adjustments. The present invention also provides for a simple to use and highly precise measurement system. Furthermore, compared to existing cell voltage and resistance measuring systems, the present invention has fewer components which significantly reduces the overall size of the system. In addition, the present invention also allows for real-time measurement which can be continuously updated. The measurement can be automated to improve measurement speed and simplicity. This invention is particularly advantageous to measure each cell voltage or voltage drop of each group of fuel cells within a large fuel cell stack consisting of a large number of fuel cells.

It should be appreciated that although the present invention is primarily intended to measure fuel cell voltage and internal resistance, it is also applicable to measure the voltage and resistance of any kind of multi-cell electrochemical device, and examples of other such devices are batteries 13 (both primary and secondary) and electrolyzers. Of course, in the case of an electrolyzer, the load is replaced with a source that provides electrical power to the electrolyzer. For secondary or rechargeable batteries the present invention can be used to monitor battery characteristics in both charge and discharge modes.

Further, while the invention has been described with voltages and current values being measured across or through individual fuel ceils, it is not always necessary to measure the values for each individual cell. Depending upon the particular electrochemical device and its construction, it may in some case be desirable or sufficient to measure values across groups of cells, e.g. across groups of 2, 3 or 4 cells for example.

It should be further understood that various modifications can be made, by those skilled in the art, to the preferred embodiment described and illustrated herein, without departing from the present invention, the scope of which is defined in the appended claims.

The invention claimed is:

1. An electrochemical system comprising a plurality of cells;
a current supply/draw means for superimposing modulated current values through the plurality of cells, wherein the current supply/draw means comprises a modulator, wherein the modulator comprises a control device and a modulated current generator, wherein the control device is operable to control the modulated current generator to superimpose the modulated current values in burst time periods for high frequency resistance measurement, with a rest time periods between the burst time periods of no superimposition of modulated current values;

an external load connected to the plurality of cells in parallel with the current supply/draw means for drawing a DC current from the plurality of cells wherein the DC current is drawn from the plurality of cells during both the rest time period and the burst time periods;

a measuring device including a plurality of inputs connected across the plurality of cells to generate signals indicative of voltage and current characteristics of the plurality of cells; and, a controller for controlling at least one system operating condition based on to the voltage and current characteristics received from the measuring device, the controller being connected to the measuring device.

2. The electrochemical system as defined in claim 1 wherein the modulator is an integral part of the controller.

3. The electrochemical system as defined in claim 1 wherein the plurality of inputs are connected across individual cells in the plurality of cells and the modulator is operable to superimpose modulated current values through the individual cells.

4. The electrochemical system as defined in claim 1 wherein the controller is operable to control, in real time, the at least one system operating condition based on the voltage and current characteristics received from the measuring device.

5. The electrochemical system as defined in claim 1, wherein the controller is operable to alert an operator based on alarm conditions determined from the voltage and current characteristics received from the measuring device.

6. The electrochemical system as claimed in claim 1, wherein the measuring device provides a plurality of primary channels for the measured voltage and current signals, there being one channel for the voltage across each cell, and wherein the measuring device includes a splitter for separating out at least the DC components of the voltages across the individual cells from the primary channels, the splitter having first channels as outputs for the DC components.

7. The electrochemical system as claimed in claim 6, wherein the splitter includes second channels as outputs for the AC components of the voltages across the individual cells.

8. The electrochemical system as claimed in claim 6, wherein the measuring device includes a plurality of instrumentation amplifiers connected to the inputs of the measuring device and having outputs providing the plurality of the primary channels and an analog multiplexer connected to at least the first channels from the channel splitter, wherein a multiplexer control line is connected between the controller and the analog multiplexer for controlling the analog multiplexer to switch sequentially between at least the first channels.

9. The electrochemical system as claimed in claim 8, which further includes a first analog to digital converter connected to the output of the analog multiplexer, a voltage data bus connected between the first analog to digital converter and the controller and an analog to digital control line connected between the controller and the first analog to digital converter for control thereof.

10. The electrochemical system as claimed in claim 9, wherein a current sensing device is provided connected in series with the individual cells for measuring the current, wherein the current sensing device is connected to the controller.

11. The electrochemical system as claimed in claim 10, wherein outputs of the current sensing device are connected to a current amplifier and wherein the current amplifier has an output for a current measurement signal connected to the controller.

12. The electrochemical system as claimed in claim 1, wherein the controller includes an input, connectable to a computing device for supply of control signals for controlling the controller.

13. A method of controlling at least one system operating condition of a multi-cell electrochemical system, the method comprising:

(a) superimposing modulated current values from a current supply/draw means across a plurality of cells of the electrochemical device in burst time periods for high frequency resistance measurement, with a rest time periods between the burst time periods of no superimposition of modulated current values;

(b) drawing current from the plurality of cells to generate voltage and current signals indicative of voltage and current characteristics of the plurality of cells; and, (C) controlling the at least one system operating condition based on the voltage and current characteristics of the plurality of cells; and, (d) connecting an external load to the plurality of cells in parallel with the current supply/draw means, wherein the external load draws a DC current from the plurality of cells during both the rest time period and the burst time periods.

14. The method as defined in claim 13 wherein step (a) comprises superimposing the modulated current values across individual cells in the plurality of cells; and step (b) comprises drawing current from the individual cells to generate voltage and current signals indicative of voltage and current characteristics of the individual cells.

15. The method as claimed in claim 13, wherein step (a) comprises controlling the superimposing to provide a series of set interference conditions, and measuring, for each interference condition, at least some of the voltage and current characteristics of the electrochemical device.

16. A method as claimed in claim 15 wherein step (a) comprises varying a frequency of the superimposed current values; step (b) comprises generating the voltage and current signals at selected frequencies for the superimposed modulated current values, and determining from the voltage and current signals a plurality of real and imaginary components of the impedance of the individual cells; and, step (c) comprises controlling the at least one system operating condition based on the plurality of real and imaginary components of the impedance of the individual cells.

17. A method as claimed in claim 13, wherein step (b) comprises connecting inputs of a plurality of differential amplifiers across individual cells of the electrochemical device, measuring the voltage and current of the cells with the plurality of differential amplifiers to generate the voltage and current signals, supplying the voltage and current signals to a multiplexer and operating the multiplexer to sequentially supply the voltage and current signals to a controller for performing step (c).

18. A method as claimed in claim 17, further comprising converting each voltage and current signal selected by the analog multiplexer to a digital signal in a voltage analog to digital converter.

19. A method as claimed in claim 18, further comprising providing a current sensing device connected in series with the cells for measuring the current through the load, measuring the voltage across the current sensing device to determine the current through the load and thereby generating a current measurement signal, and supplying the current measurement signal to the controller.

20. A method as claimed in claim 19, further comprising converting the current measurement signal to a digital current measurement signal, and supplying the digital current measurement signal to the controller.

21. An electrochemical system comprising a plurality of cells;
a measuring device including a plurality of inputs connected across the plurality of cells to generate voltage and current signals indicative of voltage and current characteristics of the plurality of cells, wherein the measuring device provides a plurality of primary channels for the voltage and current signals, there being one channel for the voltage across each cell, and wherein the measuring device includes a splitter for separating out at least the DC components of the voltages across the individual cells from the primary channels, the splitter having first channels as outputs for the DC components;
a current supply/draw means comprising a modulator for superimposing modulated current values through the plurality of cells;
an external load connected to the plurality of cells in parallel with the current supply/draw means for drawing a DC current from the plurality of cells wherein the DC current is drawn from the plurality of cells during both the rest time period and the burst time periods; and
a controller for controlling at least one system operating condition based on the voltage and current characteristics received from the measuring device the controller being connected to the measuring device.

22. The electrochemical system as claimed in claim 21, wherein the splitter includes second channels as outputs for the AC components of the voltages across the individual cells.

23. The electrochemical system as claimed in claim 21, wherein the measuring device includes a plurality of instrumentation amplifiers connected to the inputs of the measuring device and having outputs providing the plurality of the primary channels and an analog multiplexer connected to at least the first channels from the channel splitter, wherein a multiplexer control line is connected between the controller and the analog multiplexer for controlling the analog multiplexer to switch sequentially between at least the first channels.

24. The electrochemical system as claimed in claim 23, which further includes a first analog to digital converter connected to the output of the analog multiplexer, a voltage data bus connected between the first analog to digital converter and the controller and an analog to digital control line connected between the controller and the first analog to digital converter for control thereof.

25. The electrochemical system as claimed in claim 24, wherein a current sensing device is provided connected in series with the individual cells for measuring the current, wherein the current sensing device is connected to the controller.

26. The electrochemical system as claimed in claim 25, wherein outputs of the current sensing device are connected to a current amplifier and wherein the current amplifier has an output for a current measurement signal connected to the controller.

* * * * *